(12) United States Patent
Khaef

(10) Patent No.: US 8,164,959 B2
(45) Date of Patent: Apr. 24, 2012

(54) METHOD AND SYSTEM FOR PROGRAMMING NON-VOLATILE MEMORY CELLS BASED ON PROGRAMMING OF PROXIMATE MEMORY CELLS

(75) Inventor: Amin Khaef, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/509,350

(22) Filed: Jul. 24, 2009

(65) Prior Publication Data

US 2009/0296468 A1 Dec. 3, 2009

Related U.S. Application Data

(62) Division of application No. 11/820,922, filed on Jun. 19, 2007, now Pat. No. 7,567,455.

(51) Int. Cl.
G11C 11/34 (2006.01)
G11C 16/04 (2006.01)
G11C 16/06 (2006.01)

(52) U.S. Cl. .......... 365/185.3; 365/185.02; 365/185.03; 365/185.22; 365/185.24; 365/185.28

(58) Field of Classification Search .......... 365/185.02, 365/185.24, 185.28
See application file for complete search history.

(56) References Cited

U.S. PATENT DOCUMENTS

| | | | | |
|---|---|---|---|---|
| 7,400,532 B2 | 7/2008 | Aritome | | 365/185.17 |
| 7,453,723 B2 | 11/2008 | Radke | | 365/185.02 |
| 7,471,571 B2 | 12/2008 | Visconti et al. | | 365/185.29 |
| 7,688,631 B2 | 3/2010 | Kim et al. | | 365/185.19 |
| 7,952,922 B2 | 5/2011 | Aritome | | 365/185.02 |
| 2006/0120162 A1* | 6/2006 | Fujiu et al. | | 365/185.24 |
| 2006/0285391 A1* | 12/2006 | Cernea | | 365/185.22 |
| 2007/0183220 A1* | 8/2007 | Aritome | | 365/185.29 |
| 2007/0291556 A1 | 12/2007 | Kamei | | 365/189.09 |
| 2008/0019174 A1 | 1/2008 | Li | | 365/185.02 |
| 2008/0056007 A1 | 3/2008 | Kang et al. | | 365/185.22 |
| 2008/0158946 A1 | 7/2008 | Mokhlesi | | 365/185.01 |
| 2008/0158974 A1 | 7/2008 | Mokhlesi | | 365/185.18 |
| 2008/0181000 A1 | 7/2008 | Lasser | | 365/185.03 |

* cited by examiner

Primary Examiner — Ly D Pham
(74) Attorney, Agent, or Firm — Dorsey & Whitney LLP

(57) ABSTRACT

A multi-level non-volatile memory device programs cells in each row in a manner that takes into account the coupling from the programming of cells that are proximate the row to be programmed. In one example of the invention, after the row has been programmed, the proximate cells are verified by read, comparison, and, if necessary, reprogramming operations to compensate for charge added to proximate memory cells resulting from programming the row. In another example of the invention, a row of memory cells is programmed with charge levels that take into account the charge that will be added to the memory cells when proximate memory cells are subsequently programmed.

24 Claims, 11 Drawing Sheets

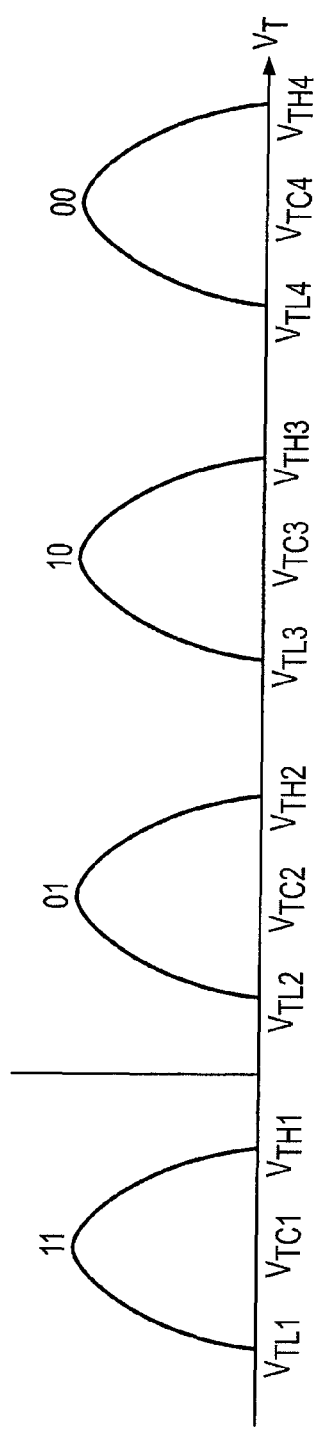
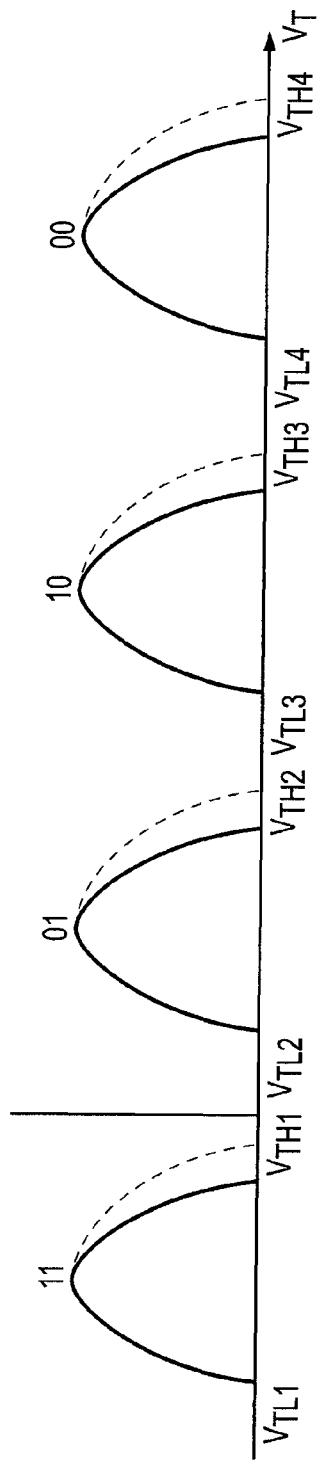
FIGURE 3 (PRIOR ART)
FIGURE 4 (PRIOR ART)

METHOD AND SYSTEM FOR PROGRAMMING NON-VOLATILE MEMORY CELLS BASED ON PROGRAMMING OF PROXIMATE MEMORY CELLS

CROSS-REFERENCE TO RELATED APPLICATION

This application is a divisional of U.S. patent application Ser. No. 11/820,922, filed Jun. 19, 2007. This application is incorporated by reference herein.

TECHNICAL FIELD

This invention relates to non-volatile memory devices, and, more particularly, to a non-volatile memory device in which the manner in which the non-volatile memory cells are programmed is based on the state to which proximate memory cells have been or will be programmed.

BACKGROUND OF THE INVENTION

Electrically erasable and programmable memory devices having arrays of flash memory cells are found in a wide variety of electrical devices. A flash memory cell, also known as a floating gate transistor memory cell, is similar to a field effect transistor, having a source region and a drain region that is spaced apart from the source region to form an intermediate channel region. A floating gate, typically made of doped polysilicon, is disposed over the channel region and is electrically isolated from the channel region by a layer of gate oxide. A control gate is fabricated over the floating gate, and it can also be made of doped polysilicon. The control gate is electrically separated from the floating gate by a dielectric layer. Thus, the floating gate is "floating" in the sense that it is insulated from the channel, the control gate and all other components of the flash memory cell.

A flash memory cell is programmed by storing charge on the floating gate. The charge thereafter remains on the gate for an indefinite period even after power has been removed from the flash memory device. Flash memory devices are therefore non-volatile. Charge is stored on the floating gate by applying appropriate voltages to the control gate and the drain or source. For example, negative charge can be placed on the floating gate by grounding the source while applying a sufficiently large positive voltage to the control gate to attract electrons, which tunnel through the gate oxide to the floating gate from the channel region. The voltage applied to the control gate, called a programming voltage, and the duration that the programming voltage is applied as well as the charge originally residing on the floating gate, determine the amount of charge residing on the floating gate after programming.

A flash memory cell can be read by applying a positive control gate to source voltage having a magnitude greater than a threshold voltage. The amount of charge stored on the flash memory cell determines the magnitude of the threshold voltage that must be applied to the control gate to allow the flash memory cell to conduct current between the source and the drain. As negative charge is added to the floating gate, the threshold voltage of the flash memory cell increases. During a read operation, a read voltage is applied to the control gate that is large enough to render the cell conductive if insufficient charge is stored on the floating gate, but not large enough to render the cell conductive if sufficient charge is stored on the floating gate. During the read operation, the drain, which is used as the output terminal of the cell, is precharged to a positive voltage, and the source is coupled to ground. Therefore, if the floating gate of the flash memory cell is sufficiently charged, the drain will remain at the positive voltage. If the floating gate of the flash memory cell is not sufficiently charged, the cell will ground the drain.

Before a flash memory cell can be programmed, it must be erased by removing charge from the floating gate. The cell can be erased by applying a gate-to-source voltage to the cell that has a polarity opposite that used for programming. Specifically, the control gate is grounded, and a large positive voltage is applied to the source to cause the electrons to tunnel through the gate oxide and deplete charge from the floating gate. In another approach, a relatively large negative voltage is applied to the control gate, and a positive voltage, such as a supply voltage, is applied to the source region.

A typical flash memory device includes a memory array containing a large number of flash memory cells arranged in rows and columns. Two common types of flash memory array architectures are the "NAND" and "NOR" architectures, so called for the logical form in which the basic flash memory cell configuration or each is arranged. FIG. 1 illustrates a typical NAND flash memory array 10 of conventional design. The array 10 is comprised of a large number of flash memory cells, collectively indicated by reference numeral 14. The array of flash memory cells 14 is typically divided into a number of blocks, one of which is shown in FIG. 1. Each block includes a number of rows, which, in the example shown in FIG. 1, includes 32 rows. The cells 14 in the same row have their control gates coupled to a common word select line 30, each of which receives a respective word line signal WL0-WL31. The cells 14 in the same column have their sources and drains connected to each other in series. Thus all of the memory cells 14 in the same column of each block are typically connected in series with each other. The drain of the upper flash memory cell 14 in the block is coupled to a bit line 20 through a first select gate transistor 24. The conductive state of the transistors 24 in each block are controlled by a source gate SG(D) signal. Each of the bit lines 20 output a respective bit line signal BL1-BLN indicative of the data bit stored in the respective column of the array 10. The bit lines 20 extend through multiple blocks to respective sense amplifiers (not shown). The source of the lower flash memory cell 14 in the block is coupled to a source line 26 through a second select gate transistor 28. The conductive state of the transistors 28 in each block are controlled by a source gate SG(S) signal. The source line 26 receives a signal SL having various magnitudes depending upon whether the memory cells 14 are being programmed, read or erased.

A read operation is performed on a row-by-row basis. When a read operation is to be performed for a selected block, the source line 26 is coupled to ground, and the select gate transistors 24, 28 for that block are turned ON responsive to high SG(D) and SG(S) signals. Also, the bit line 20 for each column is precharged to the supply voltage $V_{CC}$. Finally, a read voltage is applied to a word select line 30 for the selected row, thereby applying the read voltage to the control gates of all of the flash memory cells 14 in that row. As explained above, the magnitude of the read voltage is sufficient to turn ON all flash memory cells 14 that do not have a sufficiently charged floating gate, but insufficient to turn ON all cells that have a sufficiently charged floating gate. A voltage having a higher magnitude is applied to the word select lines 30 for all of the non-selected rows. This voltage is large enough to turn ON the flash memory cells 14 even if their floating gates are storing insufficient charge to be read as programmed. As a result, the bit line 20 for each column will be low if the cell 14 in that column of the selected row is not storing enough charge to turn OFF the device at that gate bias. Otherwise the bit line 20 remains high at $V_{CC}$. The voltage on each bit line 20 is compared to a reference voltage by a respective sense amplifier (not shown). If the voltage on the bit line 20 is less than the reference voltage, the sense amplifier outputs a voltage corresponding to a "1" binary value of the read data bit. If the voltage on the bit line 20 is greater than the reference voltage, the sense amplifier outputs a voltage corresponding to a "0" binary value of the read data bit.

When a selected row of flash memory cells 14 are to be erased, the word select line 30 for the selected row is coupled to ground, and the source line 26 for each column is coupled to a positive voltage. A high positive voltage its then applied to the sources of the flash memory cells 14. The positive voltage then depletes charge from the floating gates in all of the cells 14, thereby erasing all of the memory cells 14 in a block of rows. The flash memory cells 14 are normally erased on a block-by-block basis by grounding the word select lines 30 for all of the cells 14 in the block. Insofar as erasing the cells 14 removes charge from their floating gates, erasing the cells 14 effectively programs them to store logic "1" bit values.

When a selected row of cells 14 are to be programmed, a programming voltage is applied to the word select line 30 for the selected row, and a voltage sufficient to turn ON the remaining cells 14 is applied to the control gates of the remaining flash memory cells 14. Also, the first column select transistor 24 is turned ON and voltages corresponding to the data bits that are to be programmed are applied to the respective bit lines. If the voltage of a bit line 20 is at ground corresponding to a logic "0," additional charge will be stored in the floating gate of the flash memory cell 14 in that column of the selected row. Otherwise, a voltage on the bit line 20 corresponding to a logic "1" prevents any additional charge from being stored on the floating gate. Programming is therefore performed on a row-by-row basis.

The storage capacity of a flash memory array can be increased by storing multiple bits of data in each flash memory cell 14. This can be accomplished by storing multiple levels of charge on the floating gate of each cell 14. These memory devices are commonly referred to as multi-bit or multi-level flash memory cells, known as "MLC memory cells." In MLC cells, multiple bits of binary data corresponding to distinct threshold voltage levels defined over respective voltage ranges are stored within a single cell. Each distinct threshold voltage level corresponds to a respective combination of data bits. Specifically, the number N of bits requires $2^N$ distinct threshold voltage levels. For example, for a flash memory cell to store 2 bits of data, 4 distinct threshold voltage levels corresponding to bit states 00, 01, 10, and 11 are needed. When reading the state of the memory cell, the threshold voltage level for which the memory cell 14 conducts current corresponds to a combination of bits representing data programmed into the cell. The two or more bits stored in each flash memory cell 14 can be adjacent bits in the same page of data. However, more frequently, one bit is treated as a bit in one page of data, and the other bit is treated as the corresponding bit in an adjacent page of data. The bit states assigned to respective charge levels are normally the same for all rows of memory cells in an array. The bit states assigned to the flash memory cells in the array are usually implemented in hardware and thus cannot be changed during operation of the flash memory device.

A multi-level flash memory cell is programmed by applying a programming voltage to the control gate and holding the drain at a constant voltage over a proper time period to store enough charge in the floating gate to move the threshold voltage $V_t$ of the flash memory cell 14 to a desired level. This threshold voltage level $V_t$ represents a bit state of the cell corresponding to the combination of data bits stored in the cell. As with programming single-level flash cells, programming of multi-level cells is performed on a row-by-row basis.

FIG. 2A illustrates the cell data map for a conventional one-bit-per-cell flash cell. As shown in FIG. 2A, two separate charge levels or ranges are defined within the overall flash cell threshold voltage $V_t$ range. When reading from such a flash cell, all that is necessary is to determine whether the threshold voltage $V_t$ is above or below some level between the two levels. Threshold voltages above that level are interpreted as a single binary bit (zero or one) while voltages below that level are interpreted as the complementary binary bit (one or zero, respectively).

FIG. 2B, on the other hand, illustrates the cell data map for a multi-level flash memory cell capable of storing two bits. As can be seen in FIG. 2B, the data map defines four separate charge ranges or levels (Levels 0, 1, 2, and 3) within the range of the cell's overall maximum threshold voltage $V_t$. Each level is assigned a two-bit pair or bit-set 00, 01, 10, or 11. The multiple bits stored in each cell can be used as adjacent bits in a single page of memory. Alternatively, the multiple bits stored in each cell can be used as corresponding bits in two different pages of memory. For example, the data bits X,Y stored in the first column can be used so that X is the first data bit of one page, and Y is the first data bit of an adjacent page.

In practice, the programmed threshold voltages $V_t$ are within respective voltage ranges. For example, as shown in FIG. 3, a cell may be assigned four different threshold voltage ranges, with each range extending between a low threshold voltage $V_{TL}$ and a high threshold voltage $V_{TH}$ and centered at $V_{TC}$. In the example shown in FIG. 3, each range is 300 mV in width, and a dead space or guard band of 200 mV is located between each range. However, other values for the width of each range and the size of the guard band can be used. If the voltage detected on the cell is within the first range, the cell is storing a 00. If the voltage is within the second range, the cell is storing a 01. This continues for as many ranges that are used for the cell.

There is also a limit to the precision with which circuitry can store an analog value on the floating gate of a flash cell, particularly where multiple levels of charge must be stored. In particular, because of process variations, the flash cells across an entire array and even across a single row may not all behave identically. For these reasons, conventional circuitry for programming or erasing the flash cells typically perform these tasks in an iterative manner. Specifically, the circuitry applies an appropriate voltage level to the control gate of a cell to charge the floating gate to a target level, then interrogates the cell to determine if the floating gate has been charged to that level. If the floating gate has not been sufficiently charged, the circuitry again applies an appropriate voltage level to the control gate of the cell. This process is repeated until the floating gate has been charged to the target level. As can be appreciated, it can require a considerable period of time to program a flash memory cell in this iterative manner. If the programming voltage needed to program a cell to a desired state could be more accurately predicted, flash memory cells could be more quickly programmed.

The need to program flash memory cells in an iterative manner is at least partially the result of coupling between the floating gate of a cell being programmed and a cell that has been or will be programmed. For example, an increase in the voltage of a floating gate caused by programming a memory cell can be coupled to the floating gate of an adjacent memory cell, thereby also inadvertently programming or affecting the programmed state of the adjacent memory cell that has already been programmed. The increase in voltage can also be coupled to an adjacent memory cell that has not yet been programmed, thereby affecting the magnitude of a program voltage that will be needed to program the cell to a desired state. This data pattern sensitivity can therefore cause the data programmed on one cell to affect the programming, verification and/or reading of an adjacent cell. All of these problems are affected by the spacing between memory cells. As the demand for memory capacity continues to increase, flash memory devices are being fabricated with increasingly higher densities. As a result, the spacing between the flash memory cells continues to decrease thereby increasing the coupling between the floating gates of adjacent memory cells.

One approach to programming flash memory cells in a manner that takes into account coupling from adjacent memory cells is described in U.S. Patent Application Publication No. 2006/0002190. As described therein, the memory cells in a specific row are initially programmed to threshold voltages $V_{TL}$ that are at the low end of the ranges shown in FIG. 3. The cells in the row are then read to verify that they have been properly programmed to these voltages. If not, reprogramming and verifying is repeated in an iterative manner. After the row has been properly programmed to these lower threshold voltages $V_{TL}$, the memory cells in the adjacent row are programmed to the lower threshold voltages $V_{TL}$. The programming of this row is then verified and repeated if necessary. The programming of the cells in the adjacent row is verified and reprogrammed if necessary to ensure the floating gates of the cells in the adjacent row are programmed to normal threshold voltages $V_{TC}$, which are within the ranges shown in FIG. 3. The programming of the cells in the specific row are then verified and reprogrammed if necessary.

Unfortunately, the signal coupling to the floating gates of the cells in the first row caused by programming the cells in the second row is not uniform. Cells in the second row that are programmed to a high threshold voltage $V_T$, couple a relatively high voltage to the floating gate of a cell in the first row. The upper end of each voltage threshold range is therefore increased for cells in the first row that are adjacent cells in the second row that are programmed to a high threshold voltage. Cells in the second row that are programmed to a low threshold voltage $V_T$, couple less voltage to the floating gate of a cell in the first row. The low end of each voltage threshold range therefore remains the same for cells in the first row that are adjacent cells in the second row that are programmed to a low threshold voltage. As a result, the upper portion of the original threshold voltage ranges shown in FIG. 3 can be broadened as shown by the dotted lines in FIG. 4. As the width of the ranges are broadened, the size of the dead band between ranges becomes increasing smaller, as shown in FIG. 4. In some cases, the dead band can entirely disappear, thereby causing adjacent ranges to overlap, thereby resulting in read data errors.

There is therefore a need for a flash memory device and method for programming flash memory cells in a manner that accurately compensates for the effects of coupling between the floating gates of flash memory cells that are adjacent each other in an array.

BRIEF DESCRIPTION OF THE DRAWINGS

FIG. 3 is a diagram illustrating one example of a set of flash memory cell bit state assignments.

FIG. 4 is a diagram illustrating one example of how programming adjacent flash memory cells can affect the bit state assignments shown in FIG. 3.

DETAILED DESCRIPTION

Figure 1:
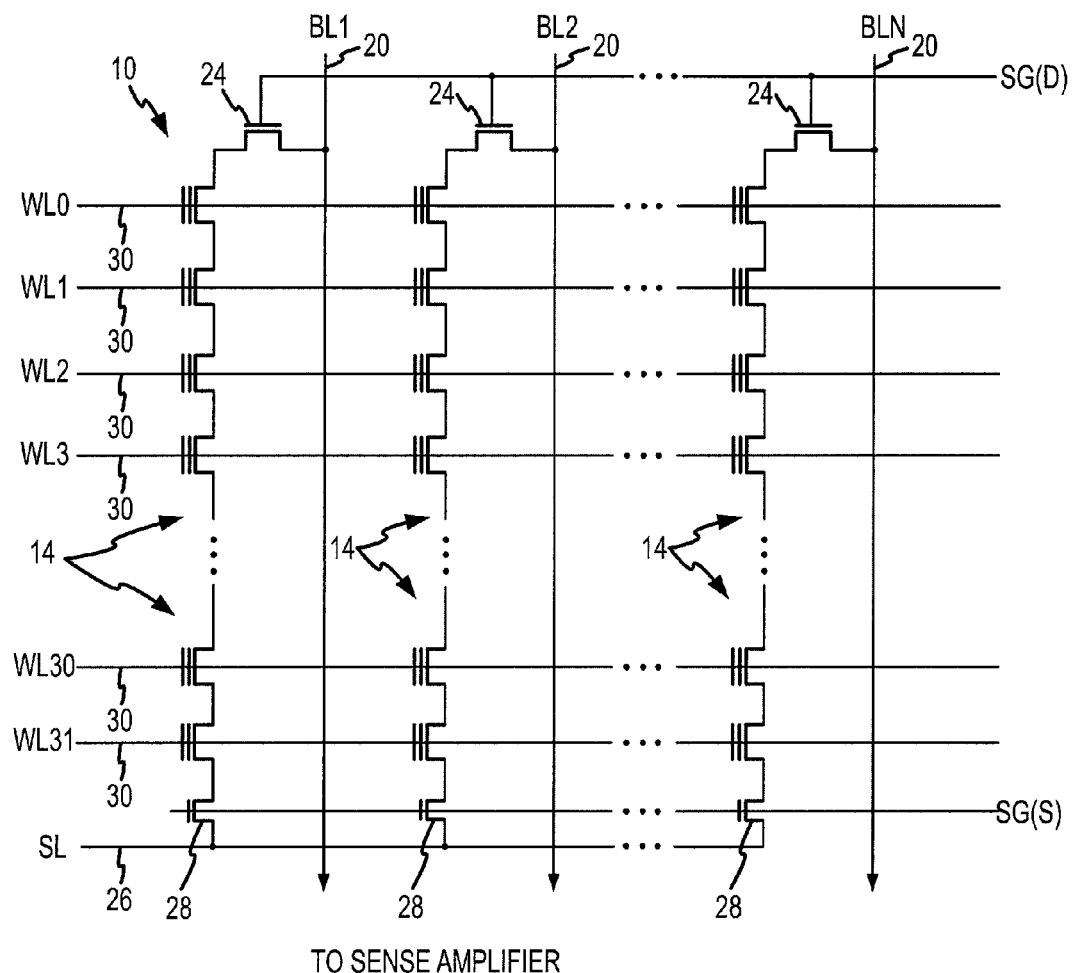
FIG. 1 is a schematic diagram showing a conventional NAND array of flash memory cells.
Figure 5:
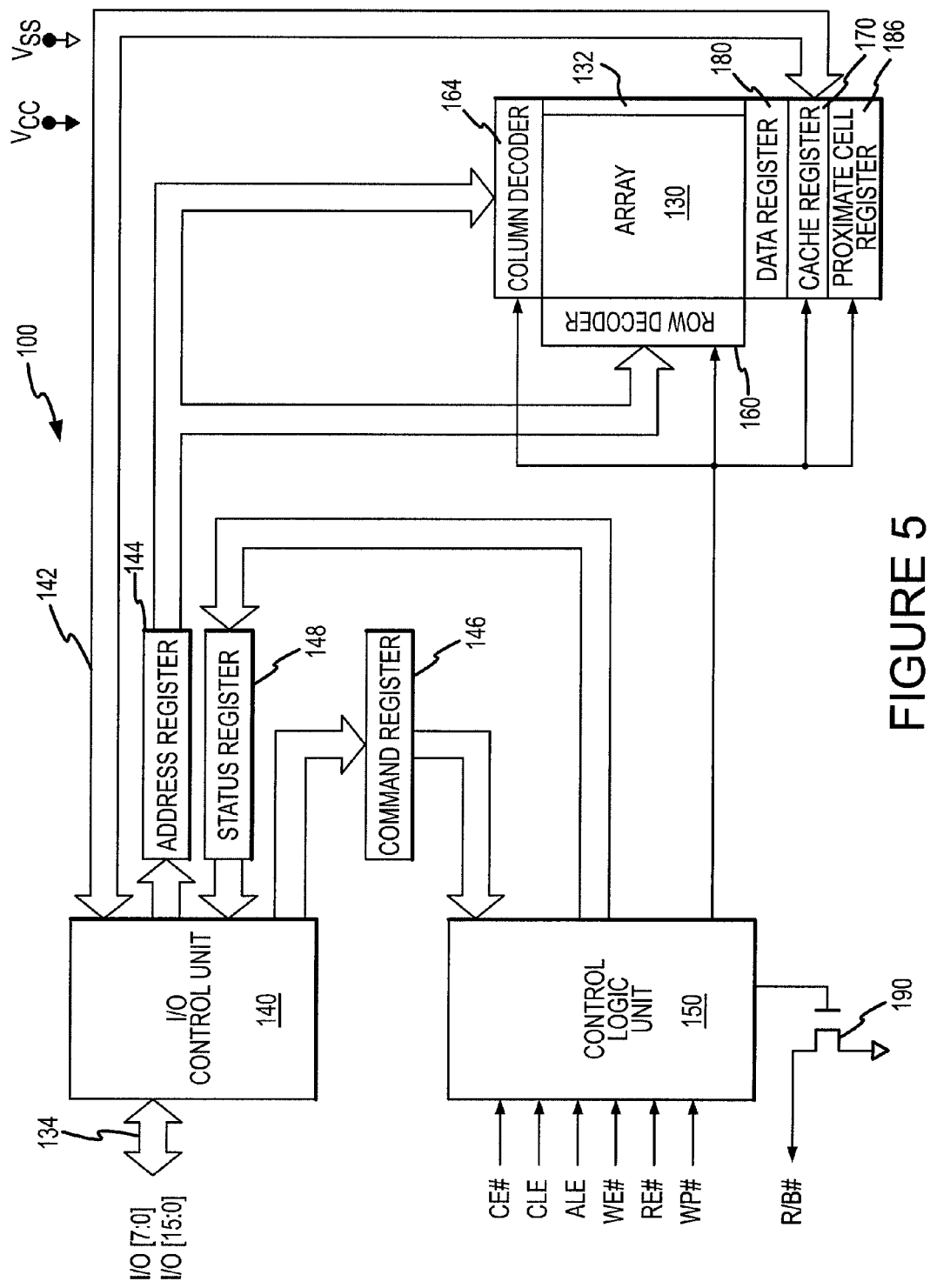
FIG. 5 is a block diagram showing a flash memory device according to one example of the invention.
Figure 6:
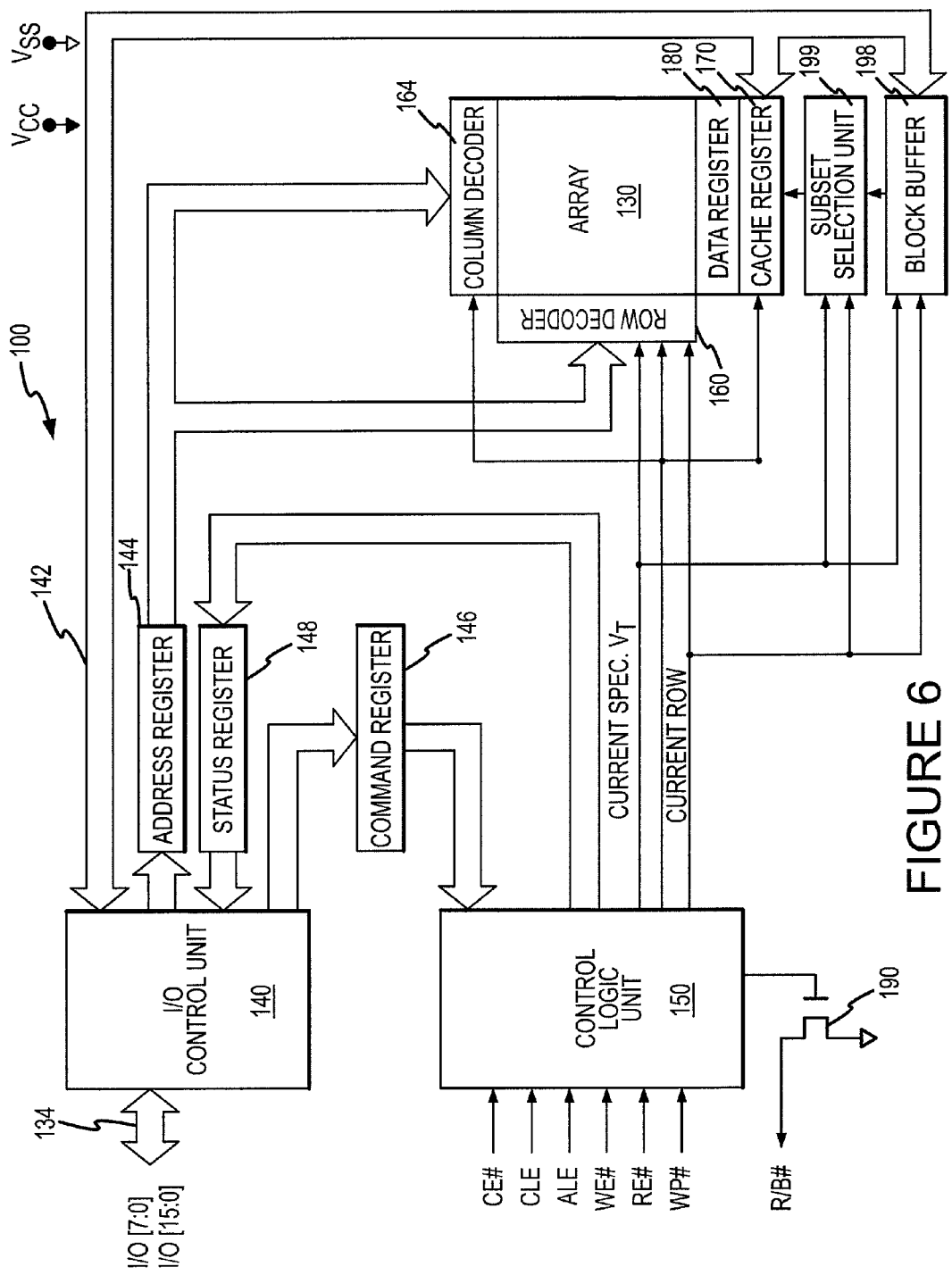
FIG. 6 is a block diagram showing a flash memory device according to another example of the invention.

FIG. 5 and FIG. 6 each show a flash memory device 100 according to two separate implementations of the invention. Both implementations of the flash memory device 100 include an array 130 of flash memory cells arranged in banks of rows and columns. The flash memory cells in the array 130 have their control gates coupled to word select lines, drain regions coupled to local bit lines, and source regions selectively coupled to a ground potential as shown in FIG. 1. In the FIG. 5 implementation, each row of the array 130 includes additional flash memory cells 132 that are used for reasons that will be explained below.

Unlike conventional dynamic random access memory ("DRAM") devices and static random access memory ("SRAM") devices, command, address and write data signals are not applied to the flash memory device 100 through respective command, address and data buses. Instead, most command signals, the address signals and the write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an address register 144, a command register 146 and a status register 148.

The flash memory device 100 also includes a control logic unit 150 that receives a number of control signals, including an active low chip enable signal CE#, a command latch enable signal CLE, an address latch enable signal ALE, an active low write enable signal WE#, an active low read enable signal RE#, and an active low write protect WP# signal. When the chip enable signal CE# is active low, command, address and data signals may be transferred between the memory device 100 and a memory access device (not shown). When the command latch enable signal CLE is active high and the ALE signal is low, the control logic unit 150 causes the I/O control unit 140 to route signals received through the I/O bus 134 to the command register 146 responsive to the rising edge of the WE# signal. Similarly, when the address latch enable signal ALE is active high and the CLE signal is low, the I/O control unit 140 routes signals received through the I/O bus 134 to the address register 146 responsive to the rising edge of the WE# signal. The write enable signal WE# is also used to gate write data signals from the memory access device (not shown) to the memory device 100, and the read enable signal RE# is used to gate the read data signals from the memory device 100 to the memory access device (not shown). The I/O control unit 140 transfers the write data signals and read data signals between the I/O bus 134 and the internal data bus 142 when the CLE and ALE signals are both low. Finally, an active low write protect signal WP# prevents the memory device 100 from inadvertently performing programming or erase functions. The control logic unit 150 is also coupled to the internal data bus 142 to receive write date from the I/O control unit for reasons that will be explained below.

The status register 148 can be read responsive to a read status command. After the read status command, all subsequent read commands will result in status data being read from the status register 148 until a subsequent read status command is received. The status data read from the status register 148 provides information about the operation of the memory device 100, such as whether programming and erase operations were completed without error.

The address register 146 stores row and column address signals applied to the memory device 100. The address register 146 then outputs the row address signals to a row decoder 160 and the column address signals to a column decoder 164. The row decoder 160 asserts word select lines 30 (FIG. 1) corresponding to the decoded row address signals. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been loaded into the address register 146, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address stored in the address register 146. In a similar manner, during a read operation, data signals from a row or page of memory cells selected by the row address stored in the address register 146 are stored in a data register 180. Sets of data signals corresponding in size to the width of the I/O bus 134 are then sequentially transferred through the I/O control unit 140 from the data register 180 to the I/O bus 134. Although the array 130 is typically read on a row-by-row or page-by-page basis, a selected portion of a selected row or page may be read by specifying a corresponding column address.

The FIG. 5 implementation of the flash memory device 130 includes a proximate cell register 186 that temporarily stores data stored in rows of memory cells for reasons that will be explained below. On the other hand, the FIG. 6 implementation includes a block buffer 198 and a subset selection unit 199, which will also be explained further below.

The flash memory device 130 also includes an NMOS transistor 190 having its gate coupled to receive a signal from the control logic unit 150. When the memory device 100 is busy processing a programming, erase or read command, the control logic unit 150 outputs a high signal to cause the transistor 190 to output an active low read/busy signal R/B#. At other times, the transistor 190 is turned OFF to indicate to memory access devices that the device 100 is able to accept and process memory commands.

Figure 12:
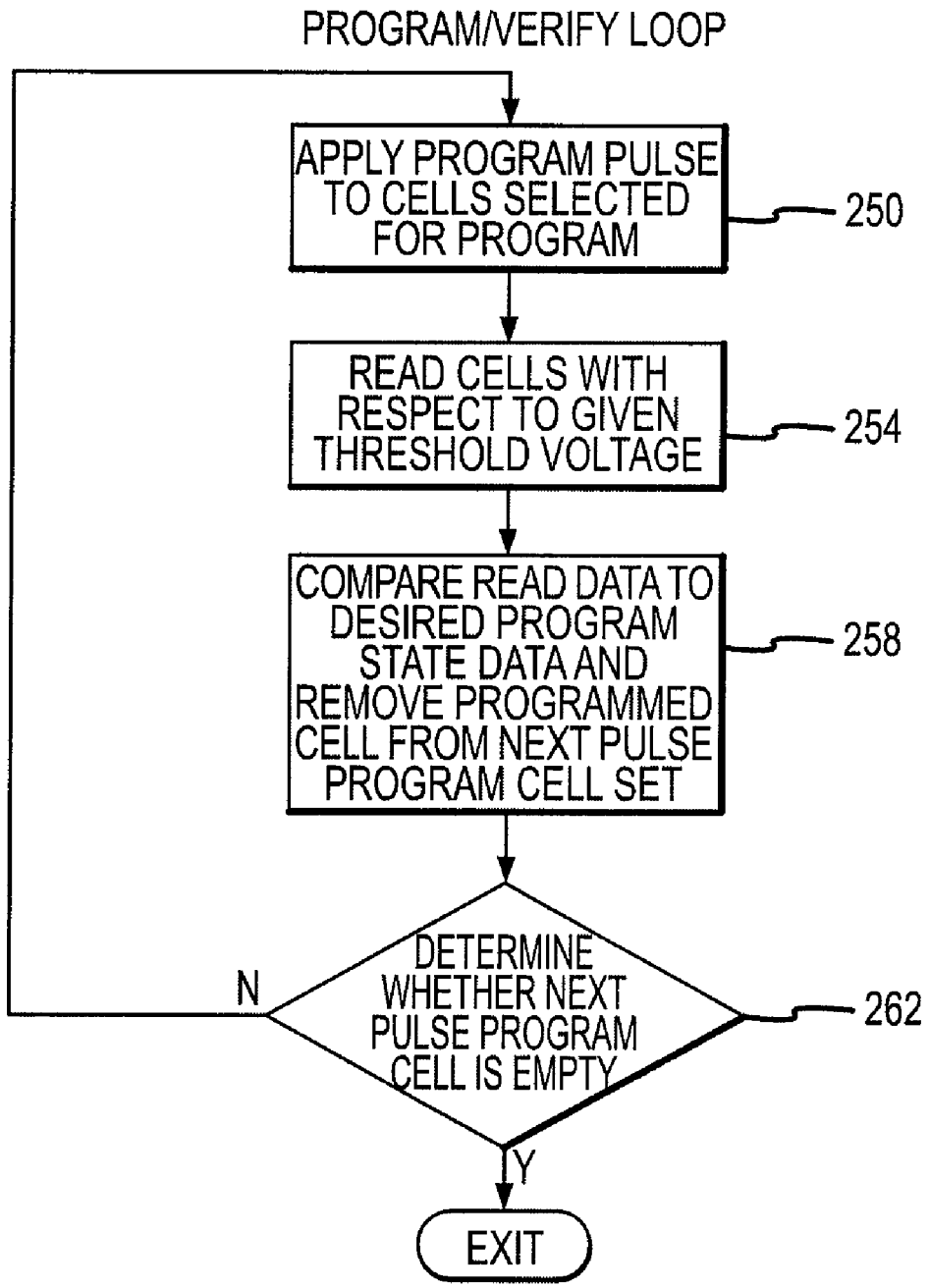
FIG. 12 is a typical procedure for programming a given set of cells to a given threshold voltage.

A typical routine for programming a given set of cells to a given threshold voltage level will now be explained with reference to the program/verify loop shown in FIG. 12. Assuming that the program/inhibit status has already been loaded to the data register, and we wish to program the cells with program status to a given threshold voltage, a typical routine is as follows. First, a program pulse is applied to the set of cells selected for program at step 250. We then proceed to step 254 where the same set of cells is read with respect to the given threshold voltage. A comparison is then done at step 258 between the desired cell data and the read cell data. Any cells determined to have a threshold voltage greater than the given threshold voltage are removed from the program set and inhibited from programming. Finally, a data match is performed at step 262 where the new program set is examined to determine whether or not there is a need to program any cells further. If the set is empty, the procedure is done and the loop exits. If not, the procedure returns to step 250 where another program pulse is applied.

Figure 2A:
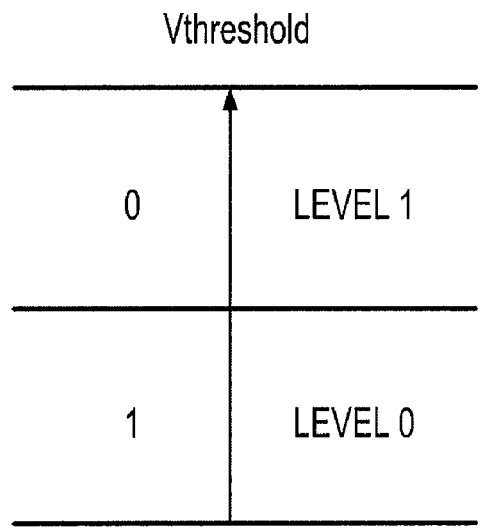
FIGS. 2A and 2B are schematic diagrams illustrating the manner in which the flash cells shown in FIG. 1 are programmed to store one or more data bits.
Figure 2B:
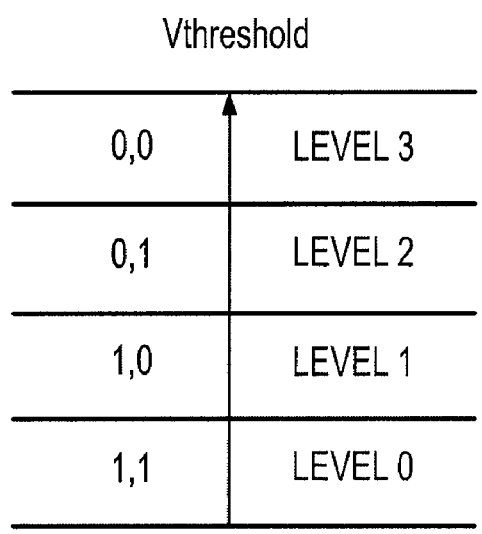
Figure 7:
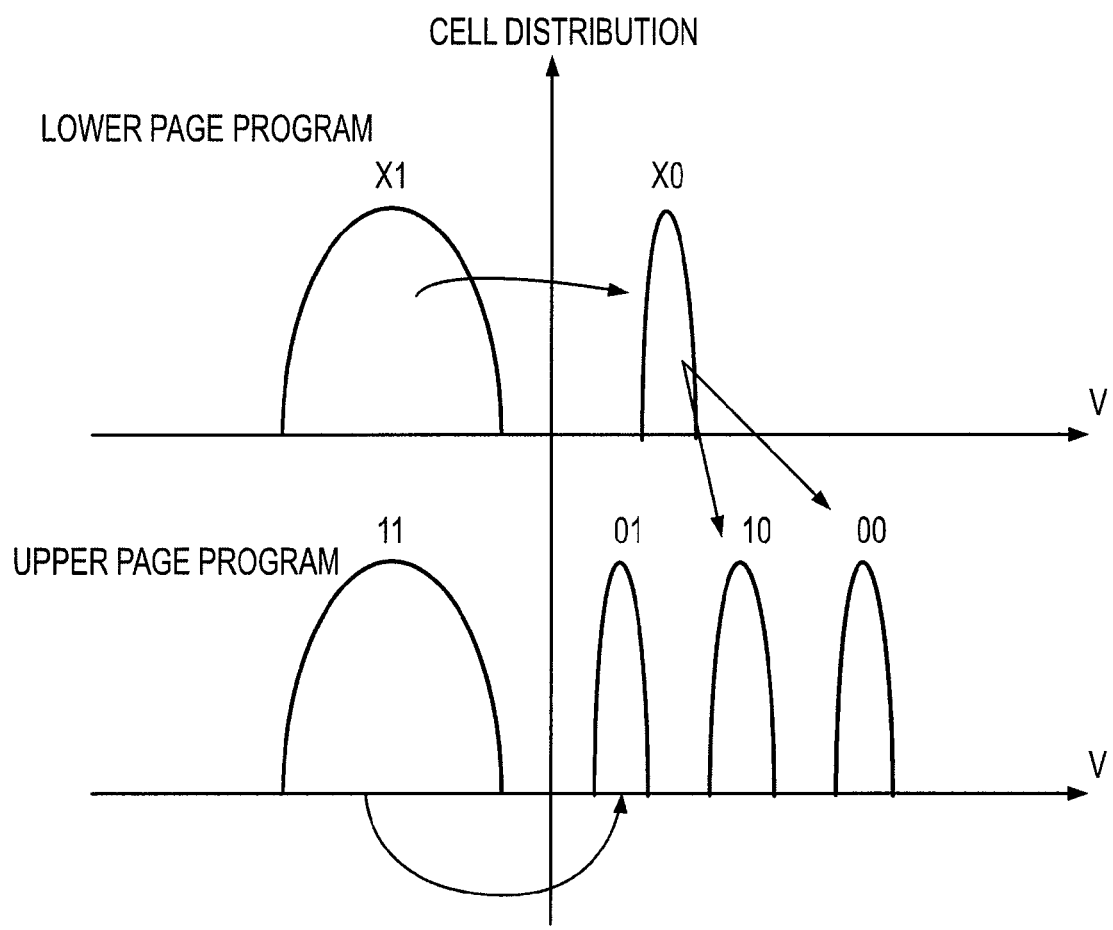
FIG. 7 is a diagram illustrating one example of how each flash memory cell in the memory device of FIG. 5 can be programmed.

In a typical MLC cell 14, the erased state of the cell 14 is assigned the 11 state, the lowest level of charge is assigned the 01 state, the next level of charge is assigned the 10 state and the highest level of charge is assigned the 00 state, as shown in FIG. 2B. As also explained above, the two or more bits stored in each flash memory cell 14 are generally processed as corresponding bits in adjacent pages of data. Specifically, of the bits XY stored in a flash memory cell 14, the bit Y is a bit in a lower page of data, and the bit X is the corresponding bit in an upper page of data. The manner in which each cell can be programmed is illustrated in FIG. 6 in which the level of charge on the floating gate of the cell 14 is plotted along the horizontal axis. During programming, the bits Y for the entire lower page are stored in the cache register 170, and these bits are then used to program respective cells 14 as shown in the upper portion of FIG. 6. If the bit Y for the lower page is 1, then the cell 14 remains in its erased state. If the bit Y for the lower page is 0, then the cell 14 is programmed to a level of charge identified by the X0 designation. While the cells 14 in a row are being programmed with the lower page of data, data bits X of an upper page are loaded into the cache register 170. These upper page data bits X are then used to program the flash memory cells 14 in the row that was previously programmed with the lower page data bits Y. Specifically, if the upper page data bit X is a 1 and the lower page data bit Y was a 1, then the cell 14 remains in its erased state. Otherwise, a small amount of charge is added to the floating gate of the cell 14 so that its charge level is indicated by the designation 01. If the lower page bit was 0 so that the charge was increased to the level designated by X0, then charge must be added when the cell 14 is programmed with the upper page bit. Specifically, if the upper page bit is a 1, then a first amount of charge is added to reach the charge level indicated by 10. If the upper page bit is a 0, then a greater amount of charge is added to reach the charge level indicated by 00. Alternatively, the cell 14 could have been programmed to the charge level designated by 10 when the cell 14 was programmed with a 0 lower page bit. In such case, an upper page bit of 1 would allow the level of charge to remain the same. However, if the upper page bit was 0, it would still be necessary to add charge to the floating gate of the cell 14 so that its charge level is indicated by the designation 00. Although one set of bit state assignments is shown in FIG. 7, it should be understood that other bit state assignments can be used.

As previously explained, the programming of a flash memory cell can affect the state of an adjacent flash memory cell. As further explained above, attempts have been made to deal with this issue, but they do not entirely resolve the issue in a satisfactory manner. One better solution according to one example of the invention will now be explained with reference to the programming procedure shown in FIG. 8 and the flash memory device in FIG. 5. As each row of flash memory cells is to be programmed, the control logic unit 150 (FIG. 5) causes data in the adjacent rows of memory cells in the array 130 to be read and temporarily stored. However, each read operation on proximate sets of cells is performed with a read threshold voltage level chosen to be lower than the nominal threshold level. For a given set of cells being read, we will refer to the threshold voltage level sets used for these particular reads as VTI. Therefore, the first step in the procedure is step 200, in which the VTIs for proximate cells are determined. The VTI levels for a given row are assumed to be previously written to the additional cells 132 of a row, and can be retrieved by reading that area. After the VTI levels for the proximate cells are determined, the control logic unit 150 then causes the proximate cells to be read at the determined VTI's, with the data read from these cells to be stored in the proximate cell register 186 at step 204. Next, in step 208, the control logic unit 150 executes a program/verify loop such as the one detailed in FIG. 12 and causes the memory cells 130 in the row being programmed to be programmed with threshold voltages $V_T$ corresponding to their respective bit states. Again, the cells are preferably programmed in step 208 to levels that are slightly lower than target threshold voltages at the start of each of the nominal threshold voltage ranges. During the program, the additional cells 132 of the row being programmed is also marked with an indication of the VT set to which the cells were programmed and verified to.

Figure 9:
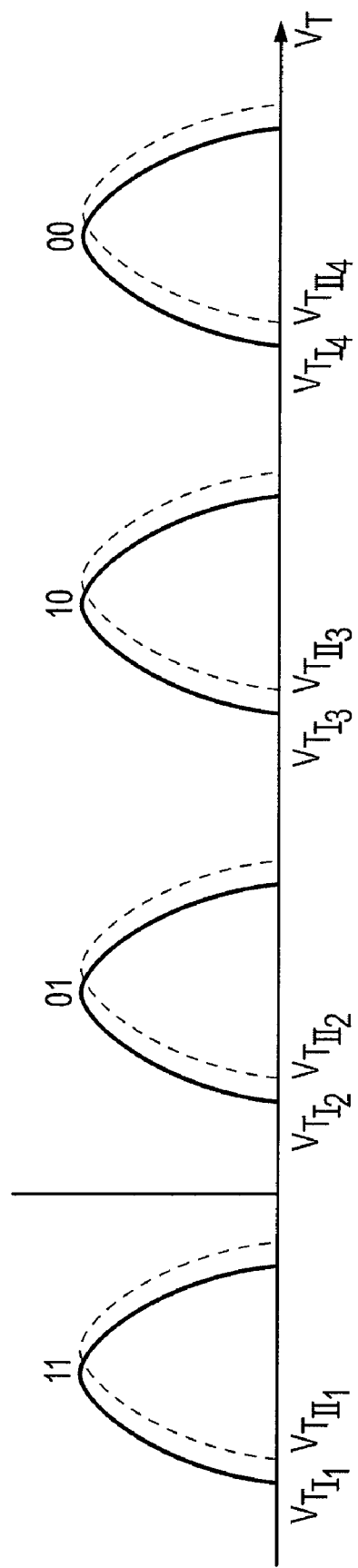
FIG. 9 illustrates how programming flash memory cells as shown in FIG. 8 can preserve the spacing between bit state assignments.

As shown in FIG. 4, programming the row of cells at step 208 may increase the threshold voltage ranges corresponding to the bit states in the proximate cells from the ranges shown in solid lines to the ranges shown in dotted lines. Clearly, some of the dead space between the states has been depleted by the program operation. The programming pulse applied at step 208 may increase the threshold voltages of the proximate memory cells in a manner that may program the proximate cells to incorrect charge states. For this reason, new threshold voltage sets are chosen for the proximate memory cells at step 209. The new threshold voltage sets VTII are chosen to be higher than the VTI sets at which they were read by an amount such that the dead space lost can be reclaimed. The control logic unit 150 then proceeds to step 210, and applies the program/verify loop to the proximate memory cells to move each of the lower boundaries of their VT sets from their respective VTI to VTII as shown in FIG. 9. Because the VT sets have been modified, the additional cells are then updated in step 212 to reflect the change for any modified rows. After this has been done, the program operation is complete, and may exit.

Because this example of the invention allows different sets of cells to have different VT to state mappings, the array must be updated after any program to reflect the mapping changes for any set of cells. For example, the previously detailed procedure with steps 200 through 218 caused a change to the VT to state mappings of the programming row as well as the proximate rows. Because of this, the additional cells 132 for each of those rows must be updated so that the same VT to state mapping can be used later on when reading back those rows.

During a memory read operation, the bit state assignment data are read from the additional cells 132 and used to determine the bit states to which the memory cells in the corresponding row are programmed. The additional flash memory cells 132 are preferably single level rather than multiple level memory cells so that the data stored therein can be more reliably read without already knowing the exact bit state assignments. Once the bit state assignments have been read from the additional memory cells 132, the multi-level cells in the same row can be reliably read.

Figure 8:
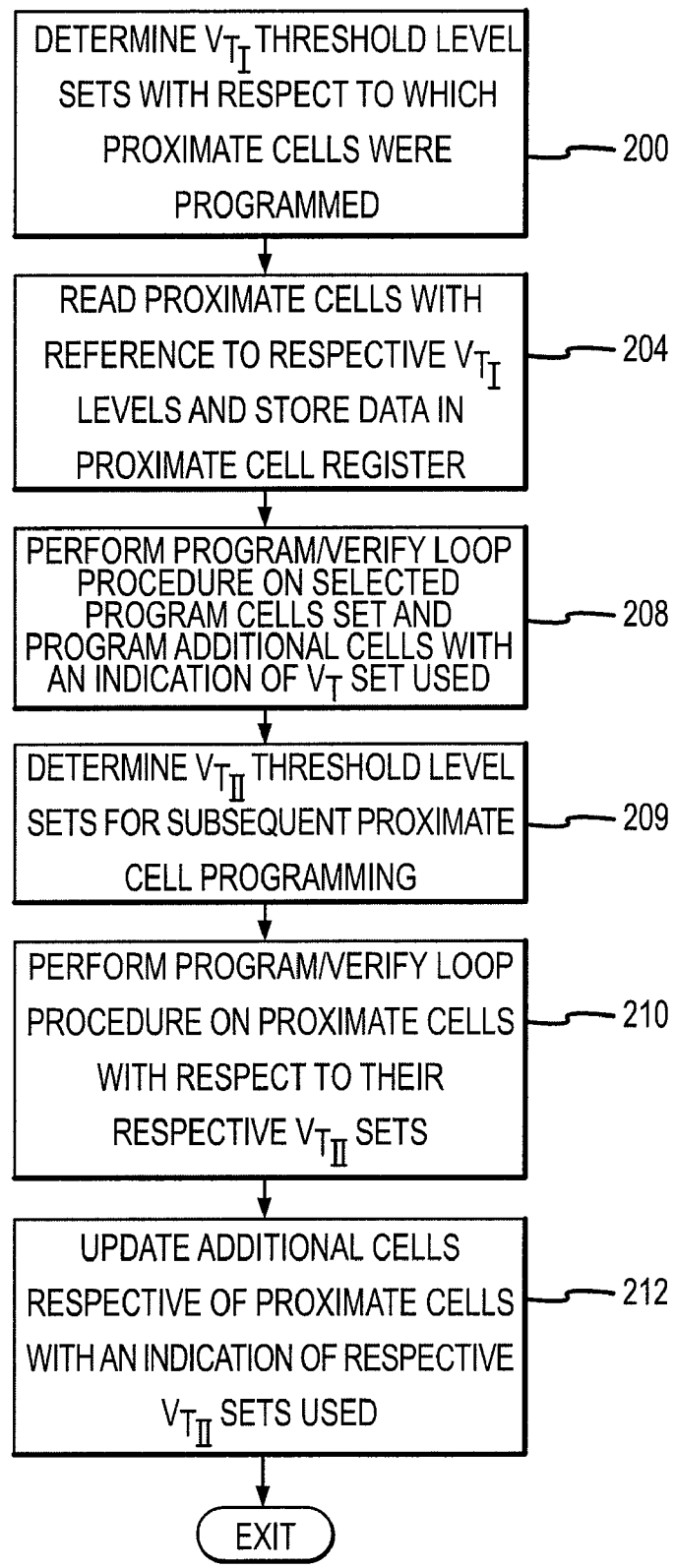
FIG. 8 is a flow chart showing one procedure for programming the flash memory cells in the memory device of FIG. 5 according to one example of the invention.

In the example shown in FIGS. 5 and 8, a row of memory cells is programmed with charge levels that may later change as a result of proximate cells being subsequently programmed. In another example of the invention shown in FIGS. 10 and 6, a row of memory cells is programmed with charge levels that take into account the charge that will be added to the memory cells when proximate memory cells are subsequently programmed.

Figure 10:
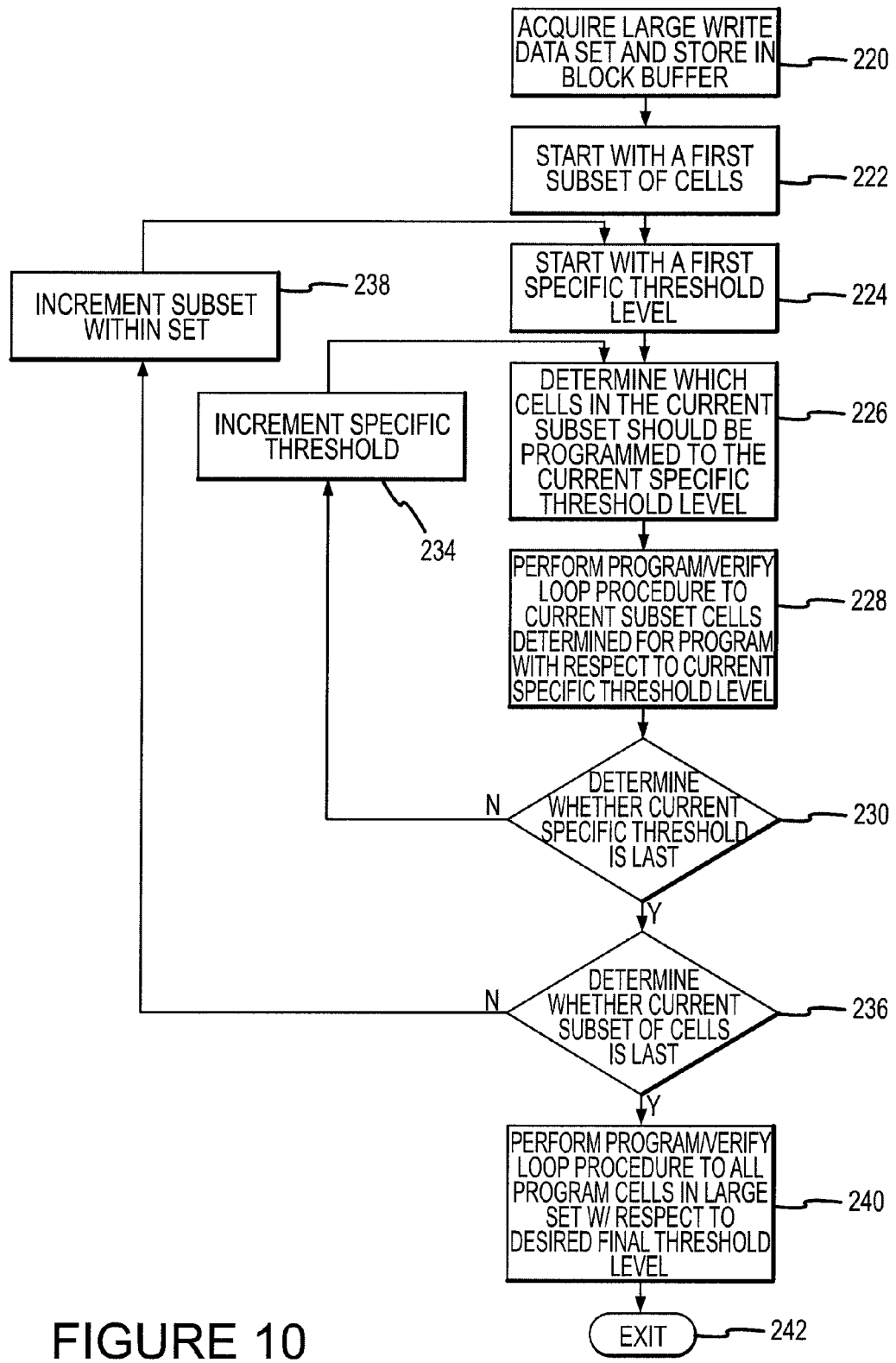
FIG. 10 is a flow chart showing the procedure for programming the flash memory cells in the memory device of FIG. 6 according to one example of the invention.

With reference to FIGS. 10 and 6, data that will be stored in a larger set of memory cells is stored in the block buffer 198. In NAND Flash, since there is no significant impact between a cell from one block and a cell from another block, loading an entire block of data is a good selection. After the block buffer is filled, the device begins an outer loop which iterates through subsets of cells that can be programmed together at once. For example, in NAND Flash, the device would iterate through pages within the block, one at a time, until there are no pages left.

For each subset of cells within the outer loop, the device will iterate through a nested loop that iterates through specific threshold voltage levels. This invention designates more than one specific threshold level per state, with each level accommodating to varying degrees of proximate data impact along with target data bit states.

At step 226 within each iteration of the nested loop, a selection of cells within the current subset of cells will be made by the subset selection unit 199. For each cell, the subset selection unit will determine whether the cell should be programmed to the current iteration's specific threshold level by deciding whether the combined effects of programming to the current iteration's specific threshold level and the impacts from proximate data will exceed the target voltage threshold level corresponding to the data to be written to the cell. In NAND Flash, the selection made by the subset selection unit can take the form of an entire page of program/inhibit bits loaded into the cache latch in parallel. Cells that are determined to be pushed outside their threshold level boundaries by the current program step are inhibited from programming.

Once the device has determined which cells will be programmed to the current threshold level and which will be inhibited, the final step of the inner loop is the program-verify loop 228, which is applied to ensure that all currently chosen cells are programmed to the current threshold level in the loop.

The nested loop is repeated for all threshold voltage levels with the current subset of cells until all threshold voltage levels have been exhausted.

The outer loop is repeated for all subsets of cells in the larger set, until all cells in the set have been exhausted.

Finally, a cleanup process consisting of a traditional program verify loop is executed to make up for any cell-to-cell variations. Cells will only be programmed slightly as needed to ensure that the threshold voltage level of each cell corresponds to the range determined for the data written to the cell.

Figure 11:
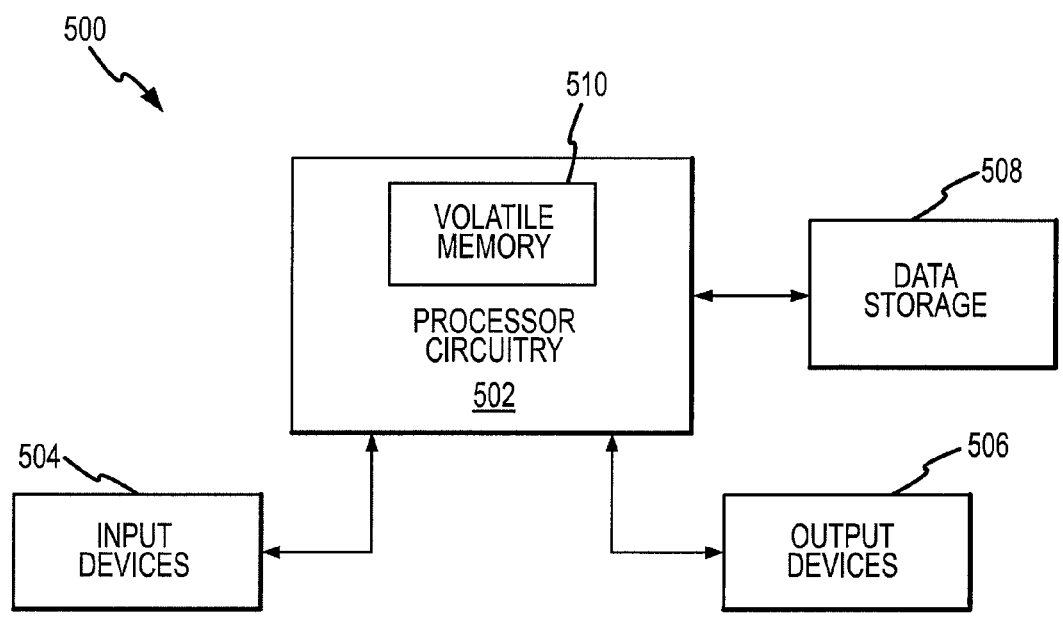
FIG. 11 is a simplified block diagram of a processor-based system including the flash memory device of FIG. 5 or a flash memory device according to some other example of the invention.

FIG. 11 is a block diagram of a processor-based system 500 including processor circuitry 502 having volatile memory 510. The processor circuitry 502 is coupled through address, data, and control buses to the volatile memory 510 to provide for writing data to and reading data from the volatile memory 510. The processor circuitry 502 includes circuitry for performing various processing functions, such as executing specific software to perform specific calculations or tasks. The processor-based system 500 also includes one or more input devices 504 coupled to the processor circuitry 502 to allow an operator to interface with the processor-based system 500. Examples of input devices 504 include keypads, touch screens, and scroll wheels. The processor-based system 500 also includes one or more output devices 506 coupled to the processor circuitry 502 to provide output information to the operator. In one example, the output device 506 is a visual display providing visual information to the operator. Data storage 508 is also coupled to the processor circuitry 502 to store data that is to be retained even when power is not supplied to the processor-based system 500 or to the data storage 508. The flash memory device 100, or a flash memory device according to some other example of the invention, can be used for the data storage 508.

Although the present invention has been described with reference to the disclosed embodiments, persons skilled in the art will recognize that changes may be made in form and detail without departing from the spirit and scope of the invention. For example, although the example of the invention is described in the context of a flash memory device, it will be understood that it may also be applicable to other types of non-volatile memory devices, including memory devices in which memory cells are not arranged or programmed in rows and columns. Such modifications are well within the skill of those ordinarily skilled in the art. Accordingly, the invention is not limited except as by the appended claims.

I claim

1. A non-volatile memory device, comprising:
    a signal bus;
    a bus interface operable to receive signals from the signal bus indicative of a memory command and a memory address, the bus interface further being operable to receive signals from the signal bus corresponding to write data and to output signals to the signal bus indicative of read data;
    an array of non-volatile memory cells, the memory cells in the array being programmable to multiple charge levels corresponding to different respective bit states; and
    a control logic unit coupled to the bus interface and the array of non-volatile memory cells, the control logic being operable to carry out operations in the array corresponding to a memory command at a location in the array corresponding to a memory address, the control logic unit further being operable to:
    read data from non-volatile memory cells in a row proximate a first row of memory cells;
    store in a temporary storage location the data read from the proximate memory cells;
    program the first row of memory cells;
    read data from the proximate memory cells;
    compare the data read from the proximate memory cells to the stored data read from the proximate memory cells;
    evaluate the comparison to determine the threshold voltages corresponding to respective bit states of the proximate memory cells; and
    based on the evaluation, apply additional charge to at least some of the proximate memory cells.

2. The non-volatile memory device of claim 1 wherein the control logic unit is structured to program the memory cells in the first row to threshold voltages that are lower than respective target threshold voltages.

3. The non-volatile memory device of claim 1, further comprising a register having the capacity to store data from a row of memory cells in the array, and wherein the control logic unit is structured to cause the data read from the proximate memory cells to be stored in the register.

4. The non-volatile memory device of claim 1 wherein the control logic unit is structured to store data indicative of the threshold voltages corresponding to respective bit states of the non-volatile memory cells in the array of non-volatile memory cells.

5. The non-volatile memory device of claim 1 wherein the control logic unit is structured to store the data indicative of the threshold voltages corresponding to respective bit states of the proximate memory cells in a plurality of the memory cells in the respective row.

6. The non-volatile memory device of claim 1 wherein the control logic unit is structured to select a threshold voltage to bit state assignment for a given set of cells based on the restrictions created by the impact of proximate data.

7. The non-volatile memory device of claim 1 wherein at least some of the non-volatile memory cells in the array comprise flash memory cells.

8. The non-volatile memory device of claim 7 wherein at least some of the flash memory cells in the array comprise multi-level flash memory cells.

9. The non-volatile memory device of claim 7 wherein at least some of the flash memory cells in each row of the array comprise a set of multi-level flash memory cells and a set of single-level flash memory cells, and wherein the control logic unit is structured to store the data indicative of the threshold voltages corresponding to respective bit states in at least some of the single level memory cells in each row.

10. A processor-based system, comprising:
    a processor operable to process data and to provide memory commands and addresses;
    an input device coupled to the processor;
    an output device coupled to the processor; and
    a non-volatile memory device, comprising:
    a signal bus;
    a bus interface operable to receive signals from the signal bus indicative of a memory command and a memory address, the bus interface further being operable to receive signals from the signal bus corresponding to write data and to output signals to the signal bus indicative of read data;
    an array of non-volatile memory cells, the memory cells in the array being programmable to multiple charge levels corresponding to different respective bit states; and
    a control logic unit coupled to the bus interface and the array of non-volatile memory cells, the control logic being operable to carry out operations in the array corresponding to a memory command at a location in the array corresponding to a memory address, the control logic unit further being operable to:
    read data from non-volatile memory cells in a row proximate a first row of memory cells;
    store in a temporary storage location the data read from the proximate memory cells;
    program the first row of memory cells;
    read data from the proximate memory cells;

compare the data read from the proximate memory cells to the stored data read from the proximate memory cells;

evaluate the comparison to determine the threshold voltages corresponding to respective bit states of the proximate memory cells; and based on the evaluation, apply additional charge to at least some of the proximate memory cells.

11. The processor-based system of claim 10 wherein the control logic unit is structured to program the memory cells in the first row to threshold voltages that are lower than respective target threshold voltages.

12. The processor-based system of claim 10, further comprising a register having the capacity to store data from a row of memory cells in the array, and wherein the control logic unit is structured to cause the data read from the proximate memory cells to be stored in the register.

13. The processor-based system of claim 10 wherein the control logic unit is structured to store data indicative of the threshold voltages corresponding to respective bit states of the non-volatile memory cells in the array of non-volatile memory cells.

14. The processor-based system of claim 13 wherein the control logic unit is structured to store the data indicative of the threshold voltages corresponding to respective bit states of the proximate memory cells in a plurality of the memory cells in the respective row.

15. The processor-based system of claim 10 wherein at least some of the non-volatile memory cells in the array comprise flash memory cells.

16. The processor-based system of claim 15 wherein at least some of the flash memory cells in the array comprise multi-level flash memory cells.

17. The processor-based system of claim 15 wherein at least some of the flash memory cells in each row of the array comprise a set of multi-level flash memory cells and a set of single-level flash memory cells, and wherein the control logic unit is structured to store the data indicative of the threshold voltages corresponding to respective bit states in at least some of the single level memory cells in each row.

18. A non-volatile memory device, comprising:
a signal bus;
a bus interface operable to receive signals from the signal bus indicative of a memory command and a memory address, the bus interface further being operable to receive signals from the signal bus corresponding to write data and to output signals to the signal bus indicative of read data;
an array of non-volatile memory cells, the memory cells in the array being programmable to multiple charge levels corresponding to different respective bit states;
a buffer for storing temporary data; and
a control logic unit coupled to the bus interface and the array of non-volatile memory cells, the control logic being operable to carry out operations in the array corresponding to a memory command at a location in the array corresponding to a memory address, the control logic unit further being operable to:
accept relevant units of data from the bus interface, and store them temporarily in the buffer;
for each cell to be programmed, determine the impact on the cell from future operations to be performed on proximate cells based on available data and programming order; and
for each cell to be programmed, determine a specific target threshold level such that the combined effects of:
programming the cell to the specific target threshold level;
the determined impact from future operations to be performed on proximate cells;
yield a final threshold level that does not exceed the bounds of the target threshold levels corresponding to the data to be written to the cell;
read each cell in the large set and determine whether the final threshold level of each cell is within the threshold level boundaries corresponding to the data requested to be written to the cell; and
make minor adjustments to the threshold levels on any cells in the set that are not within their respective boundaries, so that their final threshold levels do fall within their respective boundaries.

19. The non-volatile memory device of claim 18 wherein the relevant units of data comprise of data to be written to a set of cells such that:
for each cell in the set, any cells determined to be sufficiently proximate to the cell are also included in the set.

20. The non-volatile memory device of claim 18, wherein the relevant units of data comprise an entire flash memory block.

21. The non-volatile memory device of claim 18 wherein the impact of future operations on a cell proximate to a given cell is determined by the coupling ratio between the two cells, and the data to be written to the proximate cell.

22. The non-volatile memory device of claim 18 wherein the specific target threshold level of a cell is given by the target threshold level corresponding to the data to be written to the cell minus the determined impact.

23. The non-volatile memory device of claim 18 wherein at least some of the non-volatile memory cells in the array comprise flash memory cells.

24. The non-volatile memory device of claim 23 wherein at least some of the flash memory cells in the array comprise multi-level flash memory cells.

* * * * *